United States Patent [19]

Morimoto et al.

[11] Patent Number: 4,972,370
[45] Date of Patent: Nov. 20, 1990

[54] THREE-DIMENSIONAL MEMORY ELEMENT AND MEMORY DEVICE

[75] Inventors: Masamichi Morimoto, Fuchu; Yoshiyuki Mimura, Hachiooji; Yasuo Isono, Fussa, all of Japan

[73] Assignee: Olympus Optical Co., Ltd., Tokyo, Japan

[21] Appl. No.: 398,271

[22] Filed: Aug. 24, 1989

[30] Foreign Application Priority Data

Aug. 29, 1988 [JP] Japan .................. 63-214169

[51] Int. Cl.⁵ .................. G11C 11/22; G11C 11/24
[52] U.S. Cl. .................. 365/106; 365/107; 365/117; 365/175; 365/182; 357/4; 357/6; 357/8; 357/51
[58] Field of Search .................. 357/4, 4.5 C, 6, 8, 357/51; 365/106, 107, 175, 117, 182

[56] References Cited

U.S. PATENT DOCUMENTS

| | | | |
|---|---|---|---|
| 3,521,244 | 7/1970 | Weimer | 365/175 |
| 3,778,645 | 12/1973 | Mattauch et al. | 357/6 |
| 4,396,999 | 8/1983 | Malaviya | 365/175 |
| 4,442,507 | 4/1984 | Roesner | 365/175 |
| 4,534,015 | 8/1985 | Wilson . | |
| 4,545,035 | 10/1985 | Guterman et al. | 365/182 |
| 4,627,029 | 12/1986 | Wilson . | |
| 4,642,665 | 2/1987 | Lade et al. | 357/6 |
| 4,670,860 | 6/1987 | Wilson | 365/106 |
| 4,805,147 | 2/1989 | Yamanaka et al. | 365/182 |
| 4,813,016 | 3/1989 | Okada . | |
| 4,866,493 | 9/1989 | Arima et al. | 357/6 |

FOREIGN PATENT DOCUMENTS 62-163364 7/1987 Japan .
62-189746 8/1987 Japan .

Primary Examiner—Joseph E. Clawson, Jr.
Attorney, Agent, or Firm—Frishauf, Holtz, Goodman & Woodward

[57] ABSTRACT

A three-dimensional memory element comprises a multilayer tunnel switch portion formed by alternately stacking conductive films and insulating films, both the ends of the switch portion consisting of insulating films, a write electrode formed on the insulating film as one end of the multilayer tunnel switch portion, a read electrode formed on the insulating film as the other end of the multilayer tunnel switch portion, and charge accumulating capacitors respectively connected to the conductive films of the multilayer tunnel switch portion.

22 Claims, 11 Drawing Sheets

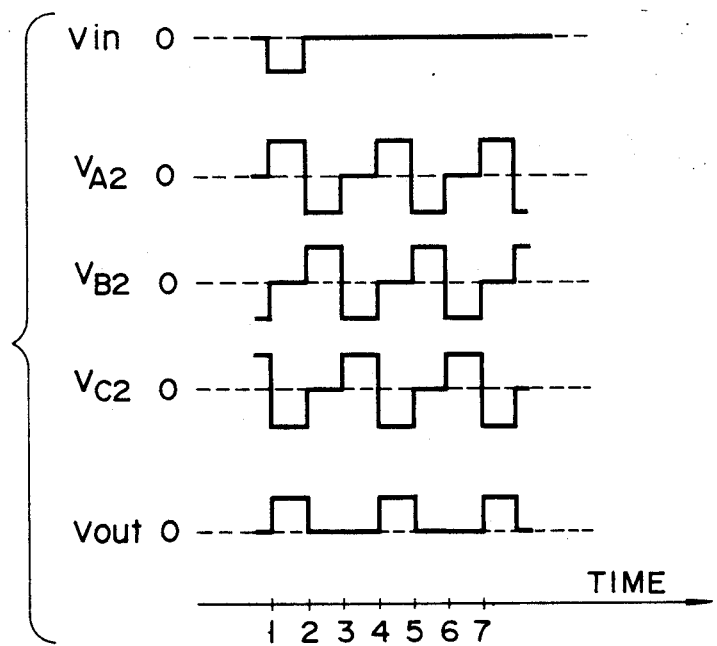
FIG. 11
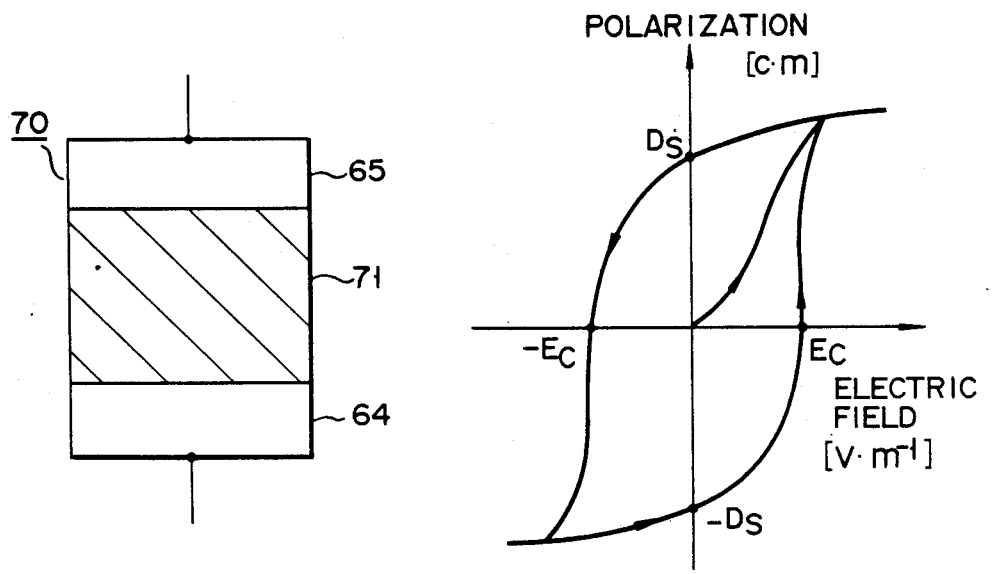
FIG. 13
FIG. 14

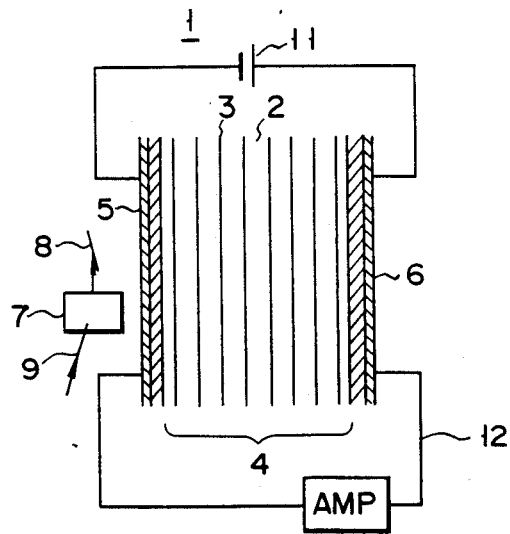
F I G. 17
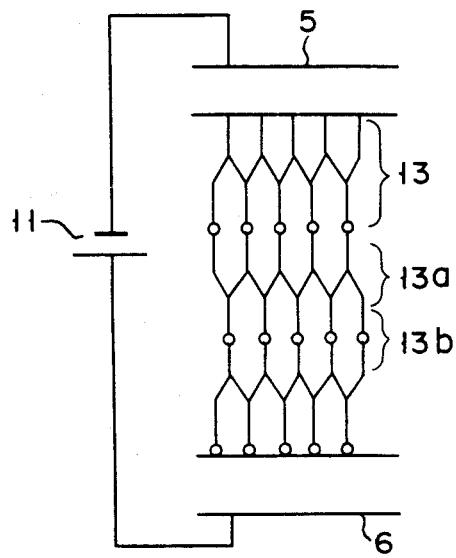
F I G. 18

F I G. 19 A
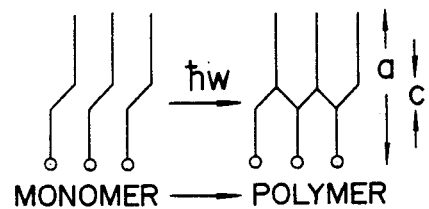
F I G. 19 B
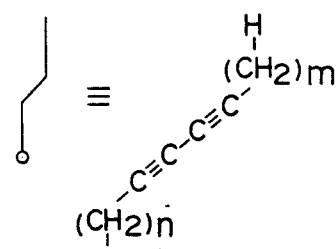
F I G. 19 C
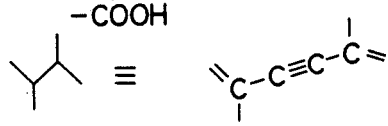
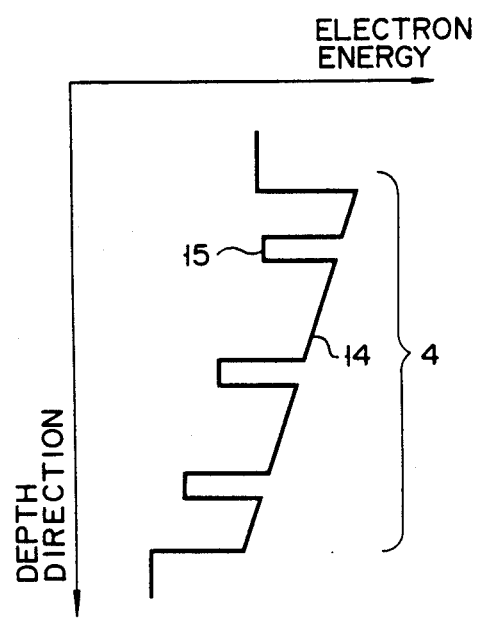
F I G. 20

THREE-DIMENSIONAL MEMORY ELEMENT AND MEMORY DEVICE

BACKGROUND OF THE INVENTION

1. Field of the Invention

The present invention relates to a three-dimensional memory element and a memory device which are used in the field of electronics and allow three-dimensional transfer and storage of charges.

2. Description of the Related Art

According to the LSI technology in the field of electronics in recent years, research and development have been directed toward micropatterning. However, since the technical development in micropatterning has almost reached its limit, research and development for three-dimensional integrated circuits (ICs) have been enthusiastically made so as to increase the packing density, the number of functions, and the processing speed of a memory. A technique using LB films is available as an effective technique for realizing three-dimensional ICs. The "LB film" is a general term of films formed by an LB method (Langmuir-Blodgett method) which is one of the methods of forming ultra thin organic films. According to the LB method, molecules can be regularly arranged on the molecular order, i.e., on the angstrom order under the conditions of normal temperature and normal pressure.

The principle of film formation by the LB method will be described below. Generally, an organic compound having a hydrophilic group can be developed to form a monomolecular film on a water surface. Especially an organic compound having a hydrophilic group at one terminal and a hydrophobic group at the other terminal, such as soap, forms a monomolecular film on a water surface while the hydrophilic group is soaked in the water if the hydrophilic and hydrophobic groups have equal strength. When a proper pressure is applied to such a monomolecular film while its surface pressure is kept at a constant value, and a substrate is vertically moved in a solution on which the monomolecular film is developed, a plurality of monomolecular films can be stacked on the substrate.

Attempts have been made by E. G. Wilson et al. to realize a large-capacity, compact memory by applying this LB film to a three-dimensional recording medium. The technical contents of these attempts are disclosed in U.S. Pat. No. 4,534,015, 4,627,029, and 4,813,016.

FIG. 17 shows a schematic arrangement of a three-dimensional memory element proposed by E. G. Wilson et al. A three-dimensional memory element 1 shown in FIG. 17 has a function of transferring charges and three-dimensionally accumulating charges by utilizing a tunnel hopping effect. This three-dimensional memory element comprises an organic monomolecular multilayer (LB film) 4 formed by alternately stacking charge accumulating portions 2 and insulating portions 3, and upper and lower electrodes 5 and 6 respectively formed on the upper and lower ends of the multilayer 4. An optical pulse generator 7 is arranged on the upper electrode side. The optical pulse generator 7 comprises a photon energy source 8, such as an LED, and a photon output adjusting unit 9. Reference numeral 11 denotes a voltage source; and 12, a voltage applying unit serving also as an amplifying feedback unit.

FIG. 18 shows the molecular structure of the organic monomolecular multilayer and the voltage source 11 which are extracted from the three-dimensional element 1 shown in FIG. 17. As shown in FIG. 18, the organic monomolecular multilayer 4 has a structure in which monomolecular layers 13 are stacked in a direction in which the upper and lower electrodes oppose each other. Conjugated bonds 13a of the polymer constituting the monomolecular layers 13 have a charge accumulating function, whereas other portions 13b have an insulating function.

FIGS. 19A to 19C show a detailed bonding state and chemical formula of the organic monomolecular multilayer 4. FIG. 19A shows a bonding state of a polymer in which derivative organic molecules (monomers) are polymerized. FIG. 19B shows the chemical formula of each monomer which is obtained by adding an alkyl group $(CH_2)_n$ having a relatively large electron affinity and a carboxyl group COOH to an organic molecule. FIG. 19C shows the molecular formula of a conjugated bond of the polymer. This conjugated bond has a large electron affinity and a charge accumulating effect.

FIG. 20 shows an electric potential of the organic monomolecular multilayer 4. The potential of the multilayer 4 has continuous upper and lower peaks 14 and 15, and hence forms a well potential array. The upper peak 14 corresponds to the alkyl and carboxyl groups in each monomolecular layer 13 shown in FIG. 19B and constitutes a potential barrier. The lower peak 15 corresponds to each conjugated bond of the polymer shown in FIG. 19C, and constitutes a charge accumulating portion in which charges are accumulated.

The three-dimensional memory element 1 having the above-described arrangement is operated in the following manner. Charges are injected in the organic "monomolecular multilayer 4 by using the voltage applying unit 12 or the optical pulse generator 7. Injection of charges by means of the voltage applying unit 12 is performed by applying a pulse voltage between the upper and lower electrodes 5 and 6. Injection of charges by means of the optical pulse generator 7 is performed by radiating light on the upper electrode 5 to generate optical charges. The charges injected in the multilayer 4 are accumulated in a charge accumulating portion located nearest to the upper electrode 5. When a voltage is applied between the upper and lower electrodes 5 and 6, the charges accumulated in the lower peak 15 sequentially tunnel-hop the upper peaks 14 (insulation portions) and are transferred from the layer nearest to the upper electrode 4 to deeper charge accumulating portions. When application of the voltage between the upper and lower electrodes 5 and 6 is stopped while charges are injected in the organic monomolecular multilayer 4, the charges are held in the respective accumulating portions as they are, and data carried by the charges is stored. When stored data is to be read out, charges accumulated in the charge accumulating portion nearest to the lower electrode 6 are read out as a current from the upper electrode 5 by applying a voltage between the upper and lower electrodes 5 and 6. Alternatively, the lower electrode 6 is made of a light-emitting conductive material so that charges accumulated in the charge accumulating portion are injected in the lower electrode 6 to be optically read out.

FIG. 21 shows an electric potential of a memory element having a MIS structure in which an organic monomolecular multilayer 4 is sandwiched between a metal member and a semiconductor member. The hydrophilic and hydrophobic groups of a molecule constituting an LB film have different potentials with reference to electrons. For this reason, the potential of an LB film formed by stacking such molecules has a structure in which upper and lower peaks alternately appear. Such an LB film is sandwiched between a metal electrode M and a semiconductor substrate S, and an electric filed E is applied to the resultant structure. Then, the potential having continuous upper and lower peaks is inclined toward the semiconductor substrate S side. In this state, light is radiated from the metal electrode M side, and electrons are injected in the LB film. The injected electrons are sequentially transferred from a first lower peak al to a second lower peak a2, ... at intervals of an average time $\tau t_n$ (tunnel hopping time). If the timings when electrons are injected and transferred are adjusted, two types of lower peaks can be formed, i.e., ones in which electrons are accumulated and ones in which no electrons are accumulated, thus forming a contrast of electron density. Within a finite time, the electrons are transferred while this contrast of electron density is kept unchanged. If application of the electric filed E is stopped during transfer, transfer of the electrons is stopped, and input data is stored in the LB film as a contrast of electron density.

In the memory element using the tunnel hopping phenomenon, a voltage is applied across both the ends of the LB film to cause charges to tunnel-hop all the upper peaks of a potential with an equal probability, thereby transferring the charges to the adjacent lower peaks of the potential. That is, all the layers are ON-/OFF-operated synchronously. The three-dimensional memory device proposed by E. G. Wilson et al. is designed such that charges can be transferred while the charge density distribution in the LB film is limited within the monomolecular films of the LB film if a voltage to be applied during tunnel hopping exceeds a predetermined value. However, since the tunnel hopping phenomenon is a phenomenon based on the theory of probability having a fluctuation, charges spread in the transfer direction with a probability distribution. This spreading substantially corresponds to $\sqrt{n}$, assuming that the total number of upper peaks (tunnel switch portions) 14 through which the charges are transferred is represented by n. This spreading can be represented by a Poisson distribution shown in FIG. 22 with the nth layer of the LB film being set as the center. Referring to FIG. 22, reference symbol $\tau t_n$ denotes a tunnel hopping time; and l, a molecular length. Such a phenomenon is a so-called diffusion phenomenon. In order to realize reliable storage and suppress disturbance of data to be transferred, this diffusion must be minimized. As a method of preventing diffusion, a method of alternately stacking more than two types of films is available. Published Unexamined Japanese Patent Application Nos. 62-163364 and 62-189746 disclose memory devices to which the above-mentioned LB hetero film is applied. Although a memory device having an LB hetero film can suppress diffusion, an LB film formation process is very complicated. In addition, since an LB hetero film is formed by stacking films made of different materials, the possibility that adjacent films greatly influence each other physically and chemically is high. Therefore, film stacking of a hetero film may not be possible or the allowable range of optimal conditions may be greatly narrowed depending on a combination of film materials, thus undesirably limiting types of film materials. Moreover, since very complicated pulse waveforms must be used to transfer charges, transfer of charges is difficult to perform.

Another problem is that a charge trap which greatly influences data transfer tends to be generated in an LB film. With regard to such a charge trap, the following report was made in 1986 Fall Meeting of the Institute of Applied Physics (30 aZK4, Morimoto et al.): "Upon observation of the transient response characteristics of an output current when a pulse was applied to an LB film, it was found that disturbance of a current waveform was caused by traps". As is apparent from this report, it is considered that the phenomenon that charges expand in the transfer direction is not simply caused by diffusion but is also associated with charge traps. In order to reduce charge traps in an LB film, impurities must be removed and film defects must be reduced. However, in the existing techniques for forming LB films, it is difficult to reduce charge traps without influencing electric conduction. Especially when hetero films are to be formed, the number of charge traps tends to increase. Therefore, if charge diffusion is prevented in LB hetero films, charge traps are simultaneously increased in number.

SUMMARY OF THE INVENTION

It is an object of the present invention to provide a memory element which allows an increase in memory capacity, can effectively prevent charge diffusion during transfer of charges, and is excellent in data holding performance and stability.

According to the present invention, there is provided a memory device comprising:

a multilayer tunnel switch portion formed by alternately stacking conductive and insulating films, both ends of the multilayer tunnel switch portion in a stacking direction being formed of insulating films;

a write electrode formed on one of the insulating film which corresponds to one end of the multilayer tunnel switch portion;

a read electrode formed on the other of the insulating film which corresponds to the other end of the multilayer tunnel switch portion;

a plurality of charge accumulating capacitors respectively connected to the conductive films of the multilayer tunnel switch portion;

a write circuit for applying a write voltage pulse to the write electrode; and a read circuit for applying a read voltage pulse to the read electrode.

According to the present invention, a voltage pulse or an optical pulse is applied to the write electrode formed on the uppermost portion of a multilayer tunnel switch portion formed by stacking conductive and insulating films. As a result, charges are injected from the write electrode in the conductive film through the insulating film at the uppermost portion. The charges injected in the conductive film are accumulated in a charge accumulating capacitor which is connected to the conductive film. When positive and negative voltage pulses are sequentially applied to the respective conductive films of the multilayer tunnel switch portion through the corresponding charge accumulating capacitors, charges stored in the respective charge accumulating capacitors are sequentially transferred to the adjacent conductive films or the adjacent charge accumulating capacitors. When a voltage is applied between the read electrode and the lowermost conductive film, charges accumulated in the capacitor connected to the lowermost conductive film are read out as a voltage or optical pulse.

BRIEF DESCRIPTION OF THE DRAWINGS

FIG. 11 is a timing chart of voltage pulses used for three-phase-driving the circuit of the second embodiment;

FIG. 13 is a view showing an arrangement of a charge accumulating capacitor;

FIG. 14 is a graph showing hysteresis characteristics of a ferroelectric member;

FIG. 17 is a view showing an arrangement of a conventional memory element;

FIG. 18 is a view showing a stacking state of an organic monomolecular multilayer;

FIG. 19A is a view showing a polymerization process from monomers to a polymer;

FIG. 19B is a view showing the molecular formula of each monomer;

FIG. 19C is a view showing the molecular formula of a conjugated bond of the polymer;

FIG. 20 is a graph showing a potential state of the organic monomolecular multilayer;

DETAILED DESCRIPTION OF THE PREFERRED EMBODIMENTS

Embodiments of the present invention which will be described below are based on the following concept.

Figures 15, 16:
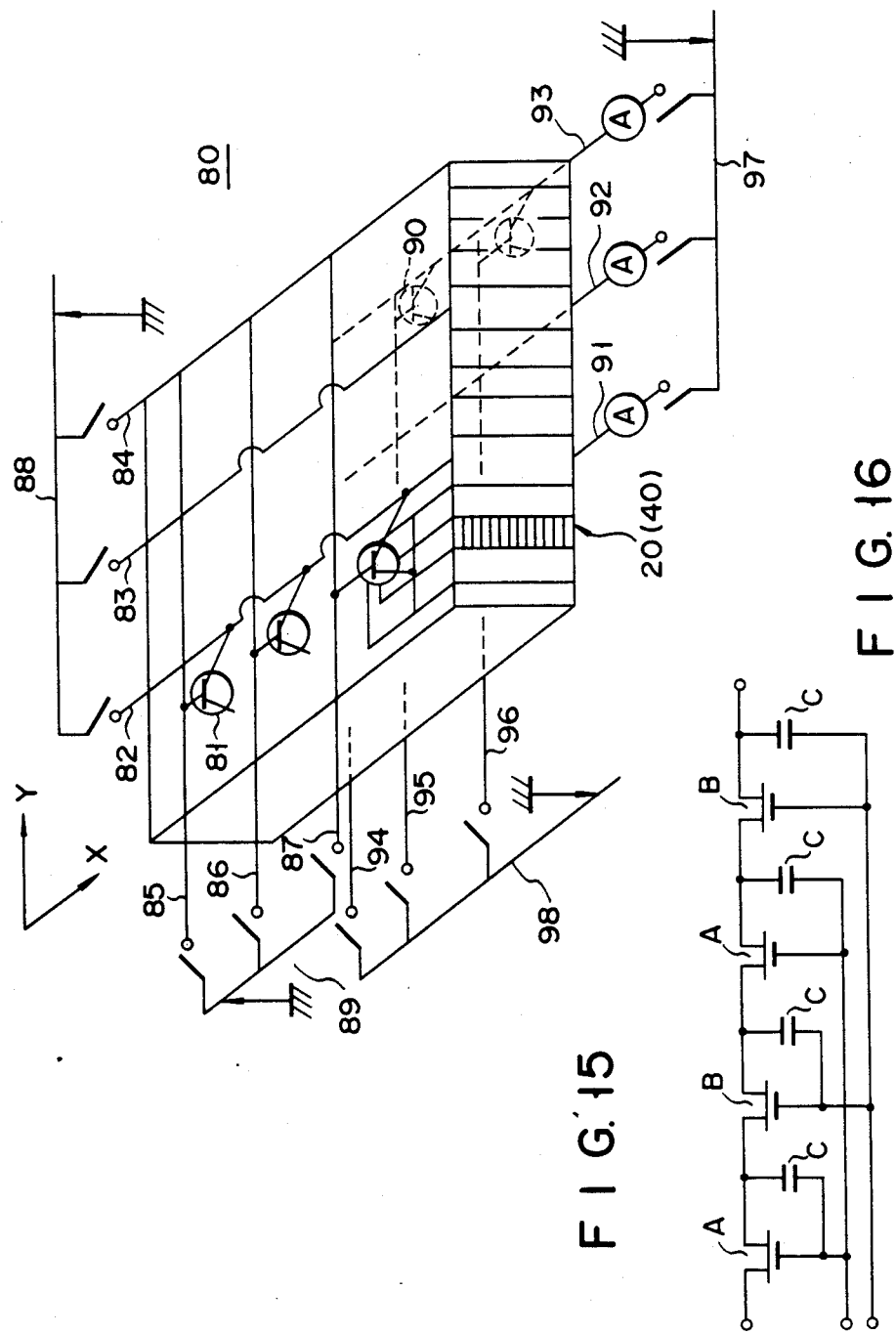
FIG. 15 is a view showing a schematic arrangement of a third embodiment.
FIG. 16 is a view for explaining the principle of charge transfer.
Figure 21:
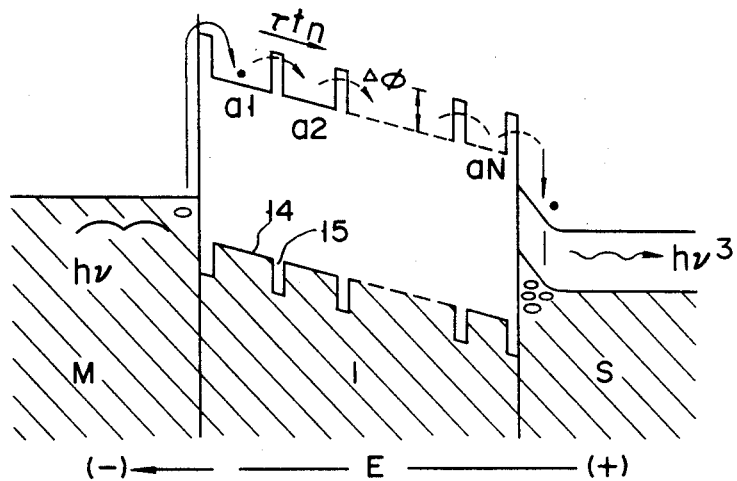
FIG. 21 is a view showing a potential state of a memory element having a MIS structure.
Figure 22:
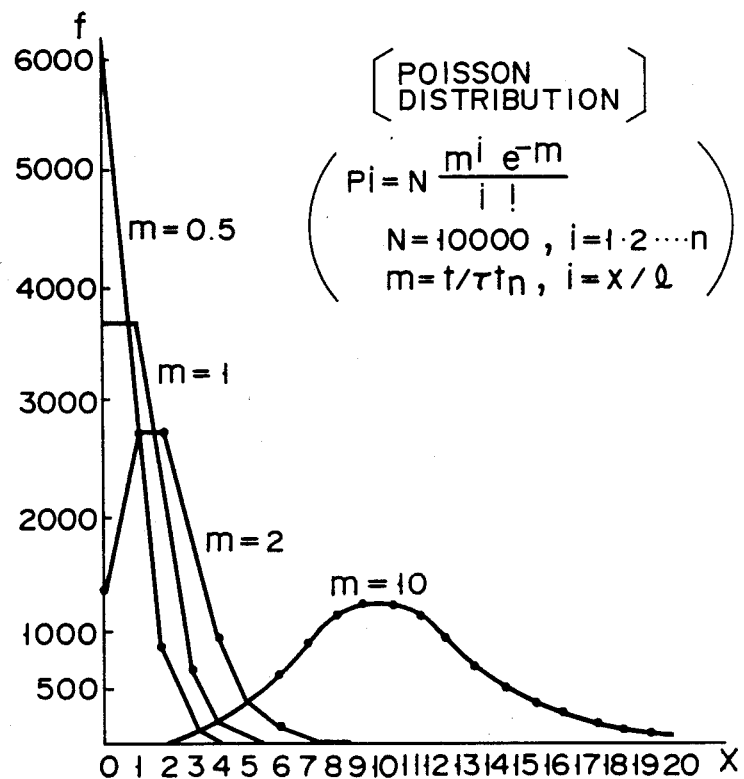
FIG. 22 is a graph showing a Poisson distribution for explaining a diffusion phenomenon occurring during transfer of charges.

In order to suppress the conventional problem of diffusion of charges in a charge transfer direction and to reliably transfer the charges, a three-dimensional memory device of this embodiment is designed such that voltages are independently applied to the respective films (portions between the lower peaks of a potential) through which charges are transferred. More specifically, as shown in FIG. 16, the three-dimensional memory device comprises two types of switching mechanisms A and B, and charge accumulating portions C. The switching mechanisms A and B are alternately arranged. The charge accumulating portions C are arranged between the respective switching mechanisms A and B. In the memory element having the above-described arrangement, if the switching mechanisms A and B are alternately opened/closed, charges are sequentially transferred. A clear pulse is applied to each charge accumulating portion C in which no charge is accumulated, thus increasing the potential of the charge accumulating portion C and reliably performing charge transfer.

Figure 1:
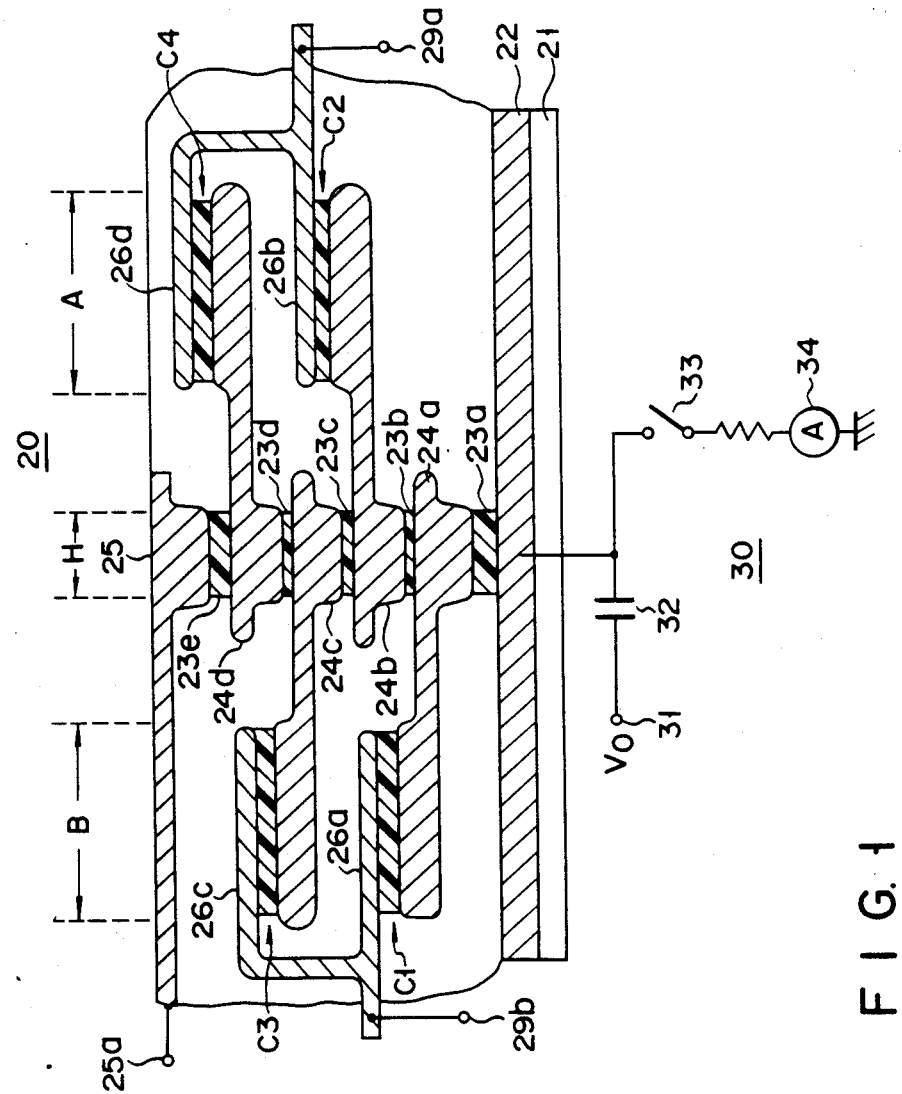
FIG. 1 is a sectional view showing an arrangement of a first embodiment.

FIG. 1 is a sectional view showing an arrangement of the three-dimensional memory device of a first embodiment of the present invention. A lower electrode 22 is formed on a substrate 21 consisting of glass or a semiconductor wafer such as Si. A multilayer tunnel switch portion H obtained by alternately stacking tunnel switch films 23a to 23e and conductive films 24a to 24d is formed on the lower electrode 22. Each tunnel switch 23 is an insulating film having a thickness of 50 to 200 Å. Each conductive film 24 is a metal film having a thickness of about 300 to 1,000 Å. An upper electrode 25 is formed on the uppermost portion of the multilayer tunnel switch portion H. The upper electrode 25 has a terminal 25a to which a voltage is applied. Charge accumulating capacitors C1 to C4 are respectively connected to the conductive films 24a to 24d. Each of the capacitors C1 to C4 comprises an extended portion of a corresponding one of the conductive films 24a to 24d as one electrode, and a corresponding one of conductive members 26a to 26d as the other electrode. The conductive members 26a to 26d are respectively formed on the capacitors C1 to C4 through high-molecular insulating films consisting of, e.g., polyparaxylylene. The charge accumulating capacitors are stacked on each other (vertically in FIG. 1) to form charge accumulating regions A and B. The capacitors C1 to C4 respectively connected to the adjacent conductive films 24a to 24d are formed in either of the different regions A and B. Each of the insulating films consisting of polyparaxylylene or the like of the capacitors C1 to C4 has a thickness of about 400 to 500 Å. Note that these insluting films can be formed by evaporation, CVD, or the like. In addition, insulating interlayers each having a thickness of about 1,000 Å are formed between the charge accumulating capacitors in the regions A and B. The conductive members 26a and 26c are commonly connected, so are the conductive members 26b and 26d. Terminals 29a and 29b are respectively formed for these pairs. A read circuit 30 is connected to the lower electrode 22. The read circuit 30 comprises a terminal 31 for receiving a pulse voltage, a capacitor 32 for temporarily storing readout charges, a switch 33, and an ammeter 34 for reading out stored data as a current. Note that the LB method is available as a typical method of stacking a plurality of tunnel switch films 23 and conductive films 24 consisting of organic materials. If the LB method is employed, about 5 to 20 monomolecular films can be stacked. In this case, the thickness of one film can be minimized to about 4 Å if polyimide or the like is used. If an unsaturated fatty acid (e.g., $\omega$ tricosanoic acid) is used, the thickness is about 20 to 30 Å. As described above, the tunnel switch film 23 is very thin as compared with other portions. If an organic thin film is used as the tunnel switch film 23, a metal film consisting of Au, Al, Cr, or the like is used as the conductive film 24. This metal film is formed by evaporation, sputtering, or the like. In addition, as the tunnel switch film 23, an organic conductive film consisting of an organic semiconductor such as polypyrrole or a charge-transfer complex film may be used. If an inorganic thin film consisting of $SiO_2$ or the like formed by, e.g., sputtering or molecular-beam epitaxy is used as the tunnel switch film 23, a metal film or a doped semiconductor film such as an amorphous Si film formed by plasma CVD or optical CVD can be used as the conductive film 24.

Figure 2:
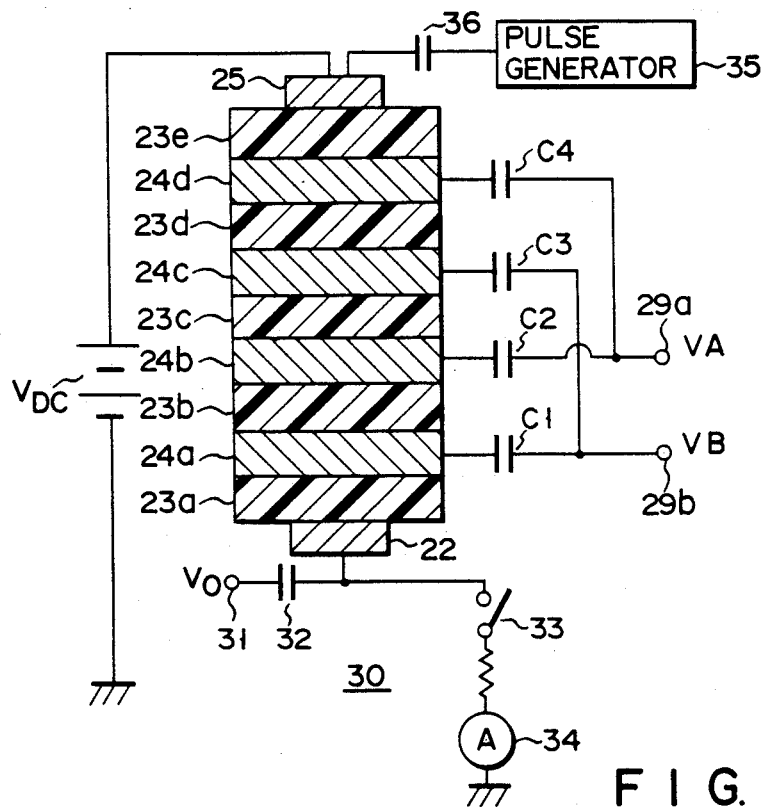
FIG. 2 is a circuit diagram showing an arrangement of the first embodiment.

FIG. 2 shows a circuit arrangement of the first embodiment. Referring to FIG. 2, $V_{DC}$ is a DC power source. The DC power source $V_{DC}$ generates a reverse flow preventing voltage to be applied between the upper and lower electrodes; and 35, a pulse generator for generating a write voltage $V_{in}$. The write voltage $V_{in}$ is applied to the upper electrode 25 through a capacitor 36.

Figure 3:
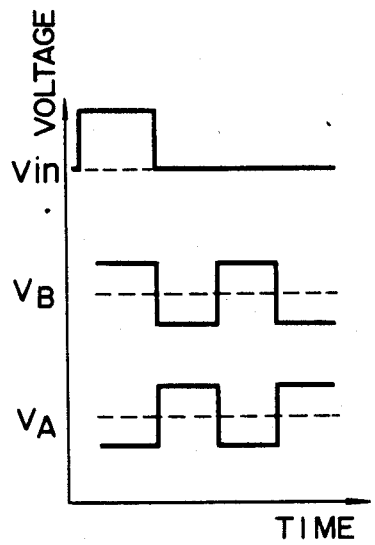
FIG. 3 is a timing chart of voltage pulses used for two-phase driving.
Figure 4:
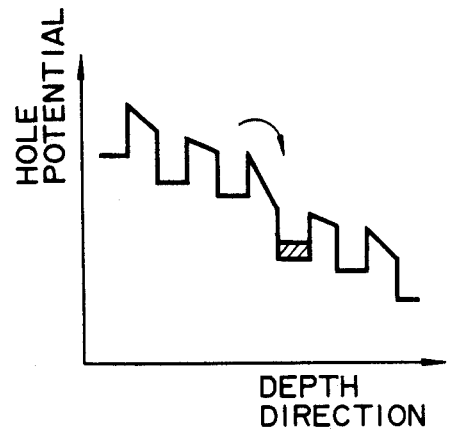
FIG. 4 is a graph showing a potential state of a multilayer tunnel switch portion in a stacking direction.

A case wherein pulse voltages VA and VB shown in FIG. 3 are applied to the terminals 29a and 29b to perform two-phase driving will be described below. A positive voltage Vin is applied to the upper electrode 25, and a negative voltage VA is applied to the conductive film 24d. As a result, charges tunnel-hop the tunnel switch film 23e to be accumulated in the charge accumulating capacitor C4. That is, a read operation is performed. Subsequently, the pulse voltages VA and VB shown in FIG. 3 are respectively applied to the conductive films 24c and 24d through the capacitors C3 and C4. When a positive portion of the pulse voltage VA is applied to the capacitor C4 in which the charges are accumulated, the charges tunnel-hop the tunnel switch film 23d to reach the adjacent (lower side in this embodiment) conductive film 24c. As a result, the capacitor C3 is charged. When a positive portion of the pulse voltage VB is applied to the capacitor C3 in which the charges are accumulated, the charges tunnel-hop the tunnel switch film 23c to be transferred to the capacitor C2 which is located at the lower side of the capacitor C3. Note that negative pulses of the pulse voltages VA and VB are clear pulses which are applied to clear the residual charges upon reading and to prevent reverse flow of charges. In this manner, the charges are sequentially transferred downward to the charge accumulating capacitors, as shown in FIG. 4. Note that a DC voltage is applied between the upper and lower electrodes 25 and 22 from the DC power source $V_{DC}$ during transfer of charges so as to prevent transfer of charges in the opposite direction of charge transfer (from the electrode 22 to the upper electrode 25). A negative pulse voltage VB is applied to the capacitor C1, and a positive voltage $V_O$ is applied to the lower electrode 22, so that the readout charges are accumulated in a capacitor 32. When a switch 33 is turned on, the stored data is detected by ammeter 34, thus reading out the charges.

As described above, according to the first embodiment, since the tunnel switch films 23 are constituted by 5 to 20 films without using an LB hetero film, and each of the charge accumulating capacitors C1 to C4 is constituted by a film having a thickness of 400 to 500 Å, the charge accumulating capacitors and the tunnel switch films 23 can be easily formed without micropores and defects. In addition, the capacitors C1 to C4 are respectively connected to the conductive films 24a to 24d, and the voltage pulses VA and VB are respectively applied to the tunnel switch films 23 through the capacitors C1 to C4, so that charges can be caused to independently tunnel-hop the respective tunnel switch films 23a to 23e. As a result, diffusion of charges in the charge transfer direction can be effectively prevented. Since charge transfer is performed by two-phase driving, driving control is very easy, and transfer can be facilitated. In addition, since the capacitors C1 and C2, and C3 and C4 which are respectively adjacent to each other with respect to the stacking direction are separately formed in the different regions A and B, leakage and mixing of charges can be reliably prevented. Furthermore, since an organic oriented film is used as the tunnel switch film 23, a multilayer consisting of several to several tens layers or having a thickness of about 100 to 500 Å can be formed. Therefore, a tunnel switch film 23 having a very high performance can be obtained. Moreover, since the tunnel switch films 23 consisting of organic oriented films can be deposited at room temperature, film formation including a process at low temperatures ($\leq 150°$ C.) can be performed.

In the first embodiment, pulse voltages are used for data write and read. However, a method employing optical pulses may be used as another method of data write and read. When optical pulses are used, a photoelectric conversion layer is formed between the upper electrode 25 and the tunnel switch film 23e, and a light-emitting layer consisting of a semiconductor or a dye conductive film for emitting light upon injection of carriers is formed between the lower electrode 22 and the tunnel switch film 23a. The photoelectric conversion layer and the light-emitting layer consist of Group II–VI compounds such as CdS and ZnS or Group III–V compounds such as GaP and InP. Transparent conductive layers consisting of ITO, $SNO_2$, $In_2O_3$, or the like are used for the upper and lower electrodes 25 and 22.

When data is to be written, optical pulses are radiated from a light source such as a laser or an LED onto the upper electrode 25 while a relatively low negative DC voltage is applied to the upper electrode 25.

When data is to be read out, a voltage is applied to the lower electrode 22 to cause the light-emitting layer to emit light, thus reading the data as optical pulses.

In the first embodiment, organic films are used for the tunnel switch films 23. However, inorganic films consisting of $SiO_2$ or the like formed by sputtering or molecular-beam epitaxy may be employed. In this case, as the conductive films 24, metal films or semiconductor films such as doped amorphous Si films formed by plasma CVD or optical CVD may be used. This is because organic films withstand about 450° C. at maximum, whereas many inorganic films such as $SiO_2$ films can withstand a high temperature of 500° C. or more and can be used at 500 to 600° C. which is required for formation of amorphous Si films and the like. Therefore, if inorganic thin films are used for the tunnel switch films 23, film formation including a process at high temperatures ($\geq 500°$ C.) can be performed.

Furthermore, in the first embodiment, charges are transferred by a two-phase driving method in which the pulse voltages VA and VB having different phases are respectively applied to the pairs of charge accumulating capacitors C1 and C3, and C2 and C4 in the two charge accumulating regions A and B. However, three charge accumulating regions may be formed so that charge transfer is performed by a three-phase driving method.

Figure 5:
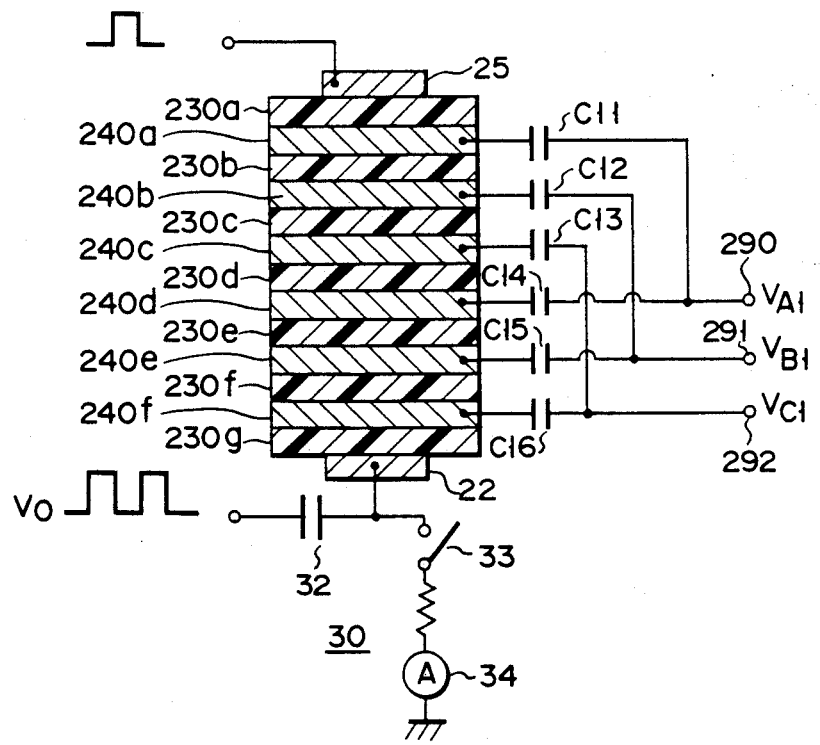
FIG. 5 is a circuit diagram showing an arrangement of a circuit for three-phase driving.

FIG. 5 shows a circuit arrangement of a three-dimensional memory device for transferring charges by the three-phase driving method.

In this three-dimensional memory device, insulating films 230a to 230g and conductive films 240a to 240f are alternately stacked, and charge accumulating capacitors C11 to C16 are respectively connected to the conductive films 240a to 240f. The capacitors C11 and C14 are commonly connected to a terminal 290. The capacitors C12 and C15 are commonly connected to a terminal 291. The capacitors C13 and C16 are commonly connected to a terminal 292. With respect to other arrangements, this three-dimensional memory device is identical to the memory device of the first embodiment.

Figure 6:
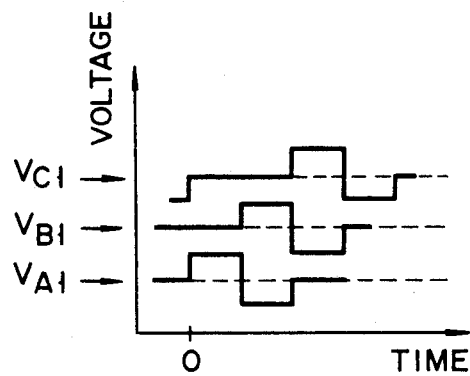
FIG. 6 is a timing chart of voltage pulses used for three-phase driving.

When data is to be written, a positive pulse is applied to an upper electrode 25, and a negative pulse VA1 is applied to the conductive film 240a through the charge accumulating capacitor C11. As a result, charges tunnel-hop the tunnel switch film 230a and are injected in the conductive film 240a to be accumulated in the capacitor C11. Charge transfer is performed by applying pulse voltages VA1, VB1, and VC1 having different phases shown in FIG. 6 to the conductive films 240a to 240f through the capacitors C11 to C16, respectively. When a positive pulse is applied to the capacitor C11 in which the charges are accumulated, a "0" pulse is applied to the adjacent capacitor C12. As a result, the charges accumulated in the capacitor C11 are transferred to the capacitor C12. If a positive pulse is applied to the capacitor C12 in which the charges are accumulated, a negative pulse is applied to the capacitor C11 to clear the residual charges and prevent reverse flow of charges. At the same time, a "0" pulse is applied to the capacitor C13. In this manner, the charges are sequentially transferred in the same manner as in the two-phase driving method. When all the electrodes are set at the same potential, the charges are held and the corresponding data is stored.

Figure 7A:
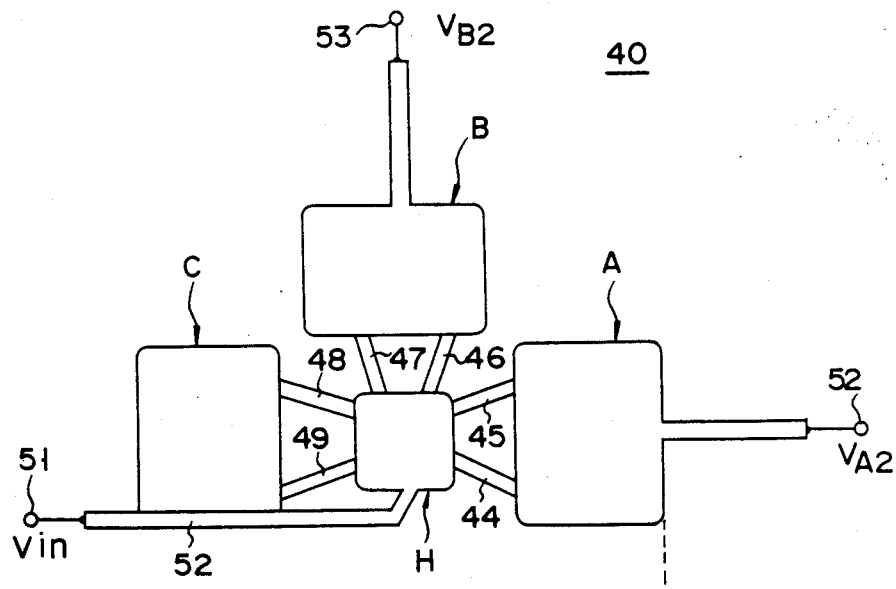
FIG. 7A is a top view showing an arrangement of a second embodiment.
Figure 7B:
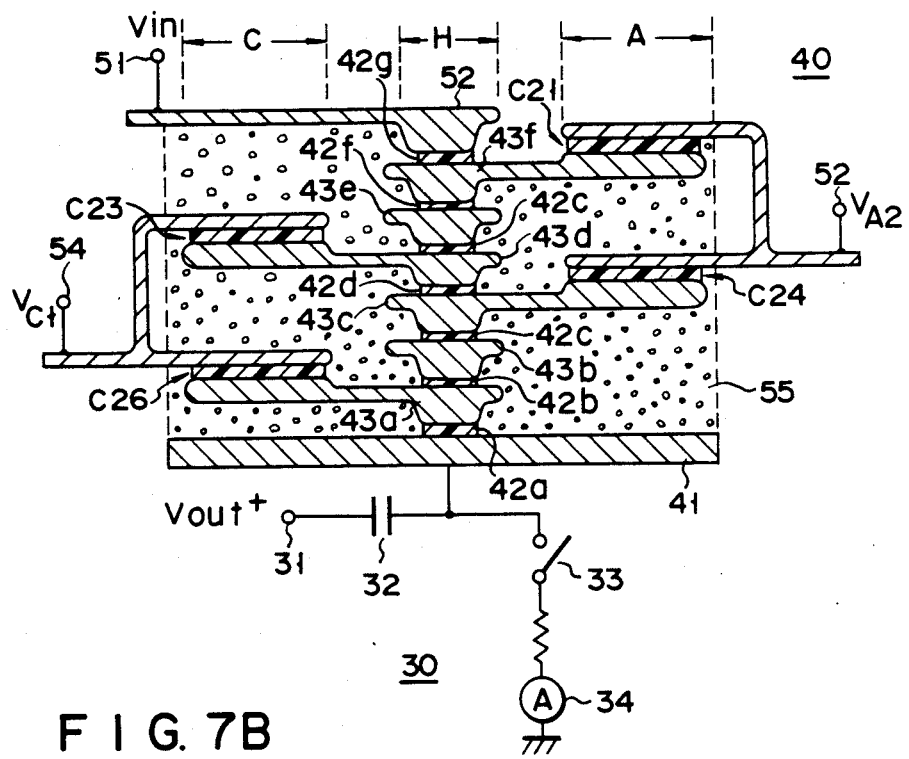
FIG. 7B is a sectional view showing an arrangement of the second embodiment.

FIGS. 7A and 7B are top and sectional views showing an arrangement of a three-dimensional memory device according to a second embodiment of the present invention. A three-dimensional memory device 40 of this embodiment comprises a charge transferring region H and charge accumulating regions A, B, and C. The region H is formed by alternately stacking tunnel switch films 42a to 42g and conductive films 43a to 43f on a substrate 41 serving also as a lower electrode. The conductive films 43a to 43f are respectively connected to charge accumulating capacitors C21 to C26 through wires 44 to 49. Each of the capacitors C21 to C26 uses a corresponding one of the conductive films connected thereto as one electrode and a corresponding one of conductive films formed on the capacitors through dielectric members as the other electrode. The three pairs of capacitors C21 and C24, C22 and C25, and C23 and C26 are respectively formed in the charge accumulating regions A, B, and C. A write electrode 42g having a terminal 51 is formed on the tunnel switch film 42a at one of the charge transferring region H. A read circuit 30 is connected to the substrate 41 as a lower electrode. The respective capacitors C formed on the regions A, B, and C are commonly connected, and terminals 52, 53, and 54 are respectively formed thereon. Insulating isolation films 55 are respectively formed between the capacitors C formed in the regions A, B, and C.

Figure 8:
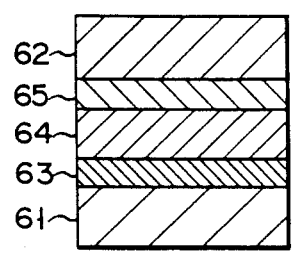
FIG. 8 is a view showing an arrangement of a charge accumulating capacitor.

FIG. 8 is a sectional view showing an arrangement of the charge accumulating capacitor C shown in FIGS. 7A and 7B. In the capacitor C, an $SiO_2$ film 63, an $Si_3N_4$ film 64, and a dielectric film 65 are stacked between one electrode 61 and the other electrode 62. The charge accumulating capacitor C is designed to perform a combination of two charge accumulating methods, i.e., a method of accumulating charges at a trap level appearing at the interface between the $SiO_2$ film 63 and the $Si_3N_4$ film 64, and a method of polarization-charging the dielectric film 65 by using accumulated charges.

In this case, the lower electrode 41 is composed of an n-type silicon monocrystalline wafer so as to allow it to function as a substrate having a sufficient mechanical strength. Each tunnel switch film 42 is an LB film consisting of polyimide and having a thickness of 100 Å. The tunnel switch film 42 consisting of an LB film is composed of organic molecules (polyimide having relatively low resistance to mechanical and thermal stresses or chemicals. For this reason, manufacturing procedures are set such that the charge accumulating regions A, B, and C are formed first, and the charge transferring region H is formed. A method of manufacturing the charge accumulating capacitor C will be described below. An Si film is formed by CVD and is oxidized by thermal oxidation to form the $SiO_2$ film 63 having a thickness of 25 Å. The 500-Å thick $Si_3N_4$ film 64 is formed on the $SiO_2$ film 63 by CVD. The 300-Å thick dielectric film 65 is formed on the $Si_3N_4$ film 64 by using a $Ta_2O_5$ film formed by sputtering. One electrode 61 and the other electrode 62 sandwiching these three films consist of 500-Å thick polysilicon films formed by CVD. The isolation films 55 consist of 1,000-Å thick $SiO_2$ films formed by sputtering and respectively have functions of electrically insulating the capacitors C from each other. Each tunnel switch film 42 as a constituent element of the charge transferring region H consists of a 100-Å thick LB film composed of polyimide. Each conductive film 43 consists of a 300 Å thick film formed by resistive heating evaporation using gold. The conductive film 43 is deposited such that part of the film 43 overlaps the other electrode 62 of the capacitor C which is previously formed, thereby electrically connecting the region H to the regions A, B, and C.

Figure 10:
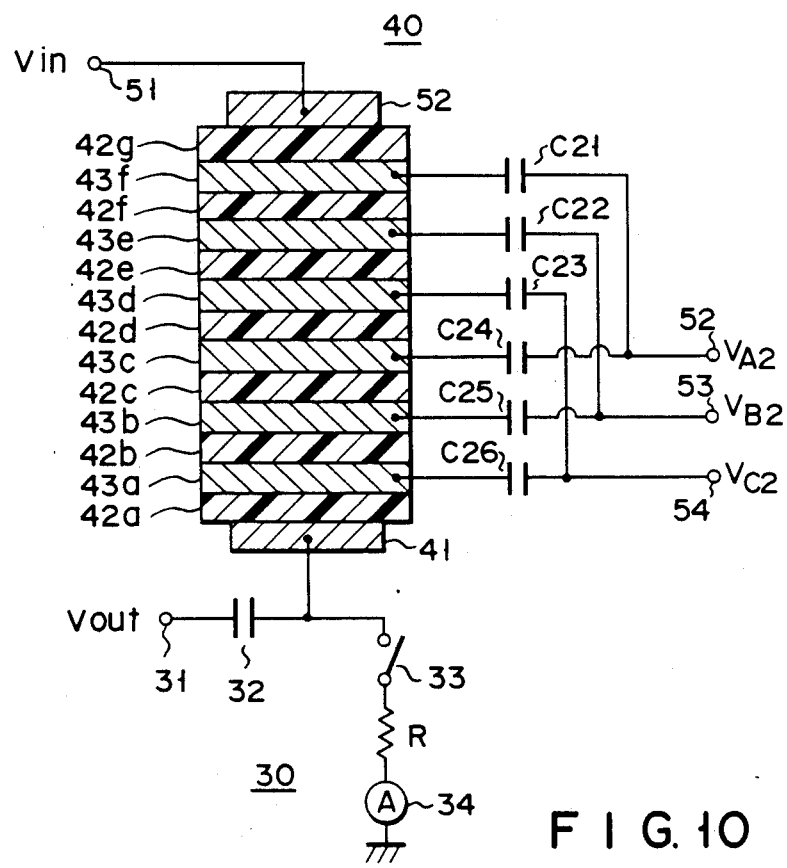
FIG. 10 is a circuit diagram showing an arrangement of the second embodiment.

FIG. 10 shows a circuit arrangement of the three-dimensional memory device 40 shown in FIGS. 7A and 7B. Voltages VA2, VB2, and VC3 having different phases are respectively applied from the terminals 52, 53, and 54 to the conductive films 43a to 43f through the charge accumulating capacitors C21 to C26. When the pulse voltages VA2, VB2, and VC2 having adjusted phases are respectively applied to the conductive films 43a to 43f through the capacitors C21 to C26, the potential of a predetermined conductive film is lowered, and charges are accumulated in the predetermined conductive film. If a combination of the voltage pulses to be applied to the respective conductive films 43a to 43f is changed, a low potential state can be sequentially shifted to each adjacent conductive film (downward in FIG. 8). Charges which are accumulated in a conductive film having a low potential are sequentially transferred to an adjacent conductive film (lower by one step). In such a charge transfer operation, only one of the tunnel switch films 42 through which charges are transferred is set in a conductive state (to be referred to as a "ON" state hereinafter), and other switch films 42 are set in an insulating state (to be referred to as an "OFF" state hereinafter). In order to realize the three-dimensional memory device 40 capable of performing such charge transfer and accumulation, insulating thin films having switching characteristics are used for the tunnel switch films 42. Each tunnel switch film 42 having such characteristics has a thickness of 50 to 500 Å. When an electric field is applied to the tunnel switch film 42, a current linearly responding to the applied electric field flows in the film due to tunnel conduction (Fowler-Norheim tunnel effect), hopping conduction (tunnel hopping conduction), or the like. That is, the film 42 exhibits two states, i.e., ON and OFF states depending on an electric field applied.

When electrons pass through an insulating film having a sufficiently large energy gap due to tunneling, a count R of electrons tunneling through the film per unit time is proportional to the electric field E as is represented by $R \propto \exp(-1/E)$. The count R is a value proportional to a current I flowing through the film. Therefore, the current I is quickly increased with an increase in the applied electric field E. Assume a pulse-like binary electric field is applied to such an insulating film. If the electric field is high in intensity, the film exhibits an ON state. If the electric field is low in intensity, the film exhibits an OFF state. The larger the difference in conductivity between the ON and OFF states, the higher the performance of the tunnel switch film 42.

Figure 12:
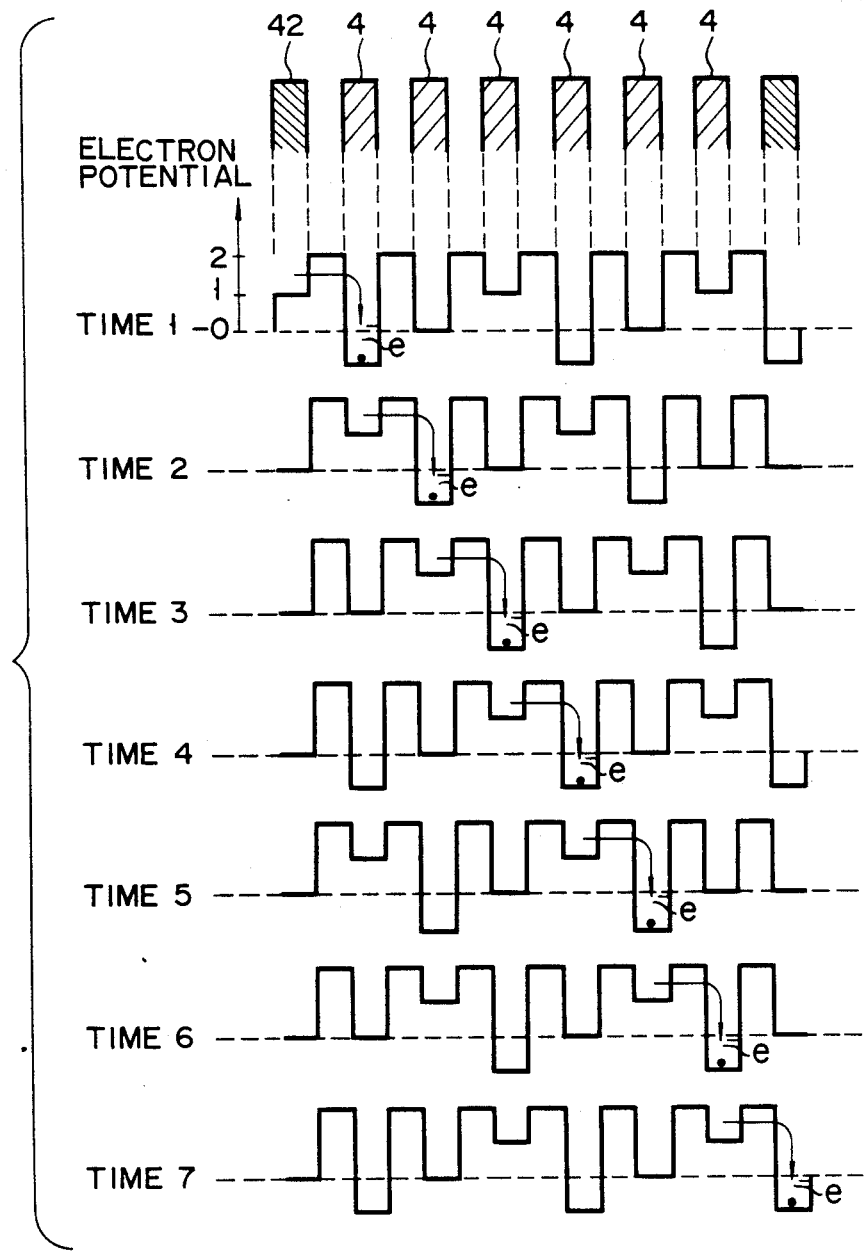
FIG. 12 is a timing chart showing changes in potential state over time.

FIG. 11 is a timing chart showing a pulse voltage Vin to be applied to the upper electrode 52 of the three-dimensional memory device 40, pulse voltages VA2, VB2, and VC2 to be respectively applied to the terminals 52, 53, and 54, and a pulse voltage Vout to be applied to the read electrode 55. FIG. 12 shows the electron potentials respectively corresponding to times 1 to 7 in FIG. 11. In order to simplify a description, the thickness of each tunnel switch film 42 is adjusted such that if the difference in potential between right and left portions of the tunnel switch film 42 corresponds to two graduations, the film 42 is set in an "ON" state, and if it corresponds to one graduation or less, the film 42 is set in an "OFF" state. At time 1, since the difference in potential between the upper electrode 52 and the conductive film 43f corresponds to two graduations, the tunnel switch film 42g interposed therebetween is set in an "ON" state. As a result, charges flow from the upper electrode 52 into the conductive film 43f, and hence the charge accumulating capacitor C21 electrically connected to the conductive film 43f is charged. At this time, since the difference in potential between the conductive films 43f and 43e corresponds to one graduation, the tunnel switch film 42f interposed therebetween is set in an "OFF" state. Consequently, the charges flowing in the conductive film 43f do not flow into the conductive film 43e. That is, the charges are present in only the conductive film 43f at time 1. At time 2, the state of the potential at time 1 is shifted to the right by one layer. In this case, since the difference in potential between the conductive films 43f and 43e corresponds to two graduation, the tunnel switch film 42f interposed therebetween is set in an "ON" state. As a result, the charges, which were present in the conductive layer 43f, flow in the conductive film 43e, and hence the capacitor electrically connected to the conductive film 34e is charged. At this time, since the difference in potential between the conductive films 43e and 43d corresponds to one graduation, the tunnel switch film 43e interposed therebetween is set in an "OFF" state. Consequently, the charges injected in the conductive film 43e do not flow in the conductive film 43d. In addition, since the difference in potential between the upper electrode 52 and the conductive film 43f corresponds to one graduation, the tunnel switch film 42g interposed therebetween is in an "OFF" state, and no electrons flow from the conductive film 43f into the upper electrode 52 (no reverse flow of electrons occurs). Subsequently, as the state of the potential is shifted by one layer at each of times 3, 4, 5, and 6, the charges are transferred to the conductive films 43c to 43a in this order. When the read pulse Vout is applied to the terminal 31, since the difference in potential between the conductive film 43a and the lower electrode 41 corresponds to two graduation, the charges supplied to the conductive film 43a flow in the lower electrode 41. As a result, a read capacitor 32 is charged. When a read switch 33 is closed, the read capacitor 32 is discharged, and a current flowing at that time is read by an ammeter 34, thereby confirming that the electrons are transferred. In this case, one swing of the pointer of the ammeter 34 indicates transfer of 1-bit data. When application of pulse voltages to the respective terminals 52, 53, and 54 is stopped in the course of transfer of electrons through the three-dimensional memory device 40, all the tunnel switch films 42 are set in an "OFF" state. As a result, the respective conductive films 43a to 43f are set in a floating state, and the charges accumulated in the capacitors C21 to C24 are held. That is, data is stored in the form of accumulation of the charges in the respective capacitors C.

In order to maximize the time (storage time) during which data is stored, a leakage current from each capacitor C must be reliably prevented. One of the factors influencing the magnitude of a leakage current from the capacitor C is the electric resistance of the tunnel switch film 42 in an "OFF" state. Since switching of the tunnel switch film 42 is based on tunneling, its film thickness is minimized. For this reason, even if no electric field is applied to the tunnel switch film 42, electrons slightly leak due to tunneling. In addition, since the electron potential of the tunnel switch film 42 is not sufficiently high (the electron affinity is a finite value), electrons receive heat energy and exceed the upper peak of the potential to leak out. Moreover, since the density of the tunnel switch film 42 is not satisfactorily high, electrons may leak from portions of the film at which the insulating strength is reduced or impurities are present.

In order to prevent current leakage from the charge accumulating capacitor C, this embodiment employs a technique applied to an MNOS (metal nitride oxide silicon) memory as one of LSI memories. More specifically, in this technique, charges are dropped to a place low in terms of energy by using a surface trap level of an insulating film, thus storing data.

Figure 9:
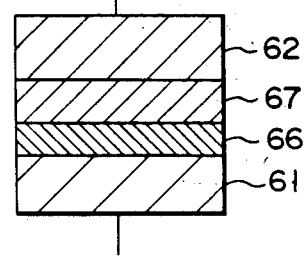
FIG. 9 is a view showing an arrangement of another charge accumulating capacitor.

FIG. 9 shows an arrangement of a charge accumulating capacitor to which the above-described technique is applied. As shown in FIG. 9, this capacitor comprises a pair of electrodes 61 and 62 sandwiching an $SiO_2$ film 66 and an $Si_3N_4$ film 67. Since a trap of electrons is generated near the interface between the $SiO_2$ film 66 and the $Si_3N_4$ film 67, the electrons flowing from the electrode 61 on the $SiO_2$ film side and tunneling through the $SiO_2$ film 66 drop into the trap and locally exist. In order to extract the trapped electrons, an electric field must be applied in a direction opposite to that of an electric field used to trap the electrons. Therefor when the tunnel switch film 42 is set in an "OFF" state while the electrons as data to be stored are trapped, even if the resistance of the film 42 in an "OFF" state is relatively small, no current leaks and the data is not erased unless a reverse voltage is applied.

As described above, in this embodiment, the dielectric film 65 is further formed between the upper electrode 52 and the $Si_3N_4$ film 64. Therefore, if an electric field is applied between the upper and lower electrodes 61 and 62, electrons drop to a trap level near the interface between the $SiO_2$ film 63 and the $Si_3N_4$ film 64. At this time, the dielectric film 65 is polarized and charged by an electric field generated by the trapped electrons.

According to the second embodiment, therefore, the same effects as those of the first embodiment can be obtained. In addition, electrons are dropped to a trap level near the interface between the $SiO_2$ film 63 (66) and the $Si_3N_4$ film 64 (67), and the dielectric film 65 is polarized and charged by an electric field generated by the trapped electrons. Therefore, in comparison to the conventional three-dimensional memory device 1, the memory device of this embodiment can accumulate a large quantity of charges, and its stability and data holding performance can be greatly improved.

In the second embodiment, the pulse voltage Vin is applied to the upper electrode 52 only at time 1 so as to cause only one of the conductive films 43 to hold charges, thus transferring one-bit data. A negative pulse may be applied to the terminal 51 for every three graduations (times 1, 4, 7, ...) on the time base (abscissa axis) in FIG. 11 so as to sequentially cause electrons to flow in series. In the charge accumulating capacitor C, the $SiO_2$ film 63 (66) may be removed, so that electrons can be accumulated at a trap level generated at the interface between the $Si_3N_4$ film 64 (67) and the electrode 62. In addition, a material which can trap and accumulate charges by using an interface level is not limited to $Si_3N_4$. The same effects as described above can be obtained by using other organic materials such as polyethylene and polyparaxylylene.

FIG. 13 is a sectional view showing a modification of the charge accumulating capacitor C of the second embodiment. A charge accumulating capacitor 70 shown in FIG. 13 is characterized in that a ferroelectric member 71 is interposed between one electrode 61 and the other electrode 62. FIG. 14 shows "electric field-polarization" characteristics of the ferroelectric member. As is apparent from FIG. 14, the ferroelectric member exhibits hysteresis (history phenomenon) between an applied electric field and polarization occurring at that time. For example, if an electric field of about 4 Ec/3 is applied and restored to zero, only polarization Ds is left. In order to cancel this residual polarization Ds, an electric field -Ec which is a reverse electric field of the electric field Ec previously applied.

The charge accumulating capacitor 70 using the ferroelectric member 71 having the above-described characteristics is manufactured in the following manner. Polysilicon films manufactured by CVD are used as the two electrodes 61 and 62. A PLZT film manufactured by sputtering is sandwiched between the two electrodes 61 and 62. Note that each of the electrodes 61 and 62 consisting of polysilicon films has a thickness of 500 Å, and the PLZT film has a thickness of 1,000 Å.

The charge accumulating capacitor 70 manufactured in this manner is used as a charge accumulating capacitor of the three-dimensional memory device 40 shown in FIG. 7. Since the PLZT film as a ferroelectric member has "electric field-polarization" characteristics exhibiting hysteresis polarization is not canceled unless a reverse electric field of a charge voltage is applied. For this reason, when, for example, a tunnel switch film is set in an "OFF" state, even if the resistance of the tunnel switch film in an "OFF" state is relatively small, since no leakage of electrons occurs, data is not erroneously erased.

When experiments were performed by using the above charge accumulating capacitor 70, mixing of transferred and readout current pulses (data) between the bits only slightly occurred, a large contrast was present between a high level and a low level, and the pulses were stable. When charges were kept accumulated in the capacitor 70, the charges were held for a long period of time while only a very small amount of charges leaked. Upon calculation of the leakage rate of the charges, it was found that the charges could be held for 10 years or more.

As the ferroelectric member 71, $PbNb_2O_9$, $KNbO_3$, $BaTiO_3$, $PbTa_2O_6$, $PbTiO_3$, $Cd_2Nb_2O_7$, SbSI, $NaNO_2$, PZT ($PbZrO_3$-$PbTiO_3$ solid solution), or PLZT (obtained by adding La to PZT) may be used. Alternatively, the ferroelectric member 71 may consist of an organic material such as polyvinylidene fluoride (PVDF) or an organic polymer containing fluorine.

FIG. 15 is a perspective view showing an arrangement of a third embodiment of the present invention. This embodiment exemplifies an IC memory obtained by integrating a large number of three-dimensional memory devices identical to the memory device 20 or 40 of the first or second embodiment in the form of a two-dimensional array. An IC memory 80 comprises a plurality of integrated memory elements 40. Each memory element 40 has a thin film transistor 81 formed on its upper end. The transistors 81 has emitters respectively connected to upper wires 82 to 84 in an X direction (longitudinal direction), and bases respectively connected to upper wires 85 to 87 in a Y direction (lateral direction). The collectors of the transistors 81 are respectively connected to upper electrodes of the memory elements. A write address switch 88 is arranged at one end of each of the upper wires 82 to 84. A write address switch 89 is arranged at one end of each of the upper wires 85 to 87. Thin film transistors 90 are respectively arranged at the lower ends of the memory elements 40 constituting the IC memory 80. The transistors 90 have emitters respectively connected to lower wires 91 to 93 in the X direction, and bases respectively connected to lower wires 94 to 96 in the Y direction. A read address switch 97 is arranged at one end of each of the lower wires 91 to 93. A read address switch 98 is connected to one end of each of the lower wires 94 to 96. Note that the electrodes of the respective transistors 81 and 90 function for switch control and for adjustment of output currents.

The IC memory 80 having the above-described arrangement is operated as follows. The write address switches 88 and 89 are selectively turned on to arbitrarily apply a voltage to one of the transistors 81. As a result, a corresponding memory element is two-dimensionally addressed, and data is written in a corresponding unit cell by the transistor 81. When the read address switches 97 and 98 are selectively turned on, data is read out from an arbitrary memory element.

As described above according to the third embodiment, since a plurality of three-dimensional memory elements are integrated to form an XY address structure similar to a semiconductor (VLSI) EEPROM, an arbitrary memory element can be write- and read-accessed, and at the same time data charges can be simultaneously transferred in the depth direction by parallel processing. In addition, the memory capacity can be greatly increased.

What is claimed is:

1. A three-dimensional memory element comprising:
a multilayer tunnel switch portion formed of conductive and insulating films which are alternately stacked, both ends of said multilayer tunnel switch portion in a stacking direction being formed of insulating films;

a write electrode formed on one of said insulating films which corresponds to one of both the ends of said multilayer tunnel switch portion;

a read electrode formed on the other of said insulating films which corresponds to the other of both the ends of said multilayer tunnel switch portion; and a plurality of charge accumulating capacitors respectively connected to said conductive films of said multilayer tunnel switch portion.

2. An element according to claim 1, wherein each of said conductive films is formed of a metal film.

3. An element according to claim 2, wherein said metal film is formed of a material selected from the group consisting of Au, Al, and Cr.

4. An element according to claim 1, wherein each of said conductive films is formed of an organic conductive film.

5. An element according to claim 4, wherein said organic conductive film is formed of a material selected from the group consisting of polypyrrole and a charge-transfer complex.

6. An element according to claim 1, wherein each of said conductive films is formed of an inorganic ceramic conductive film.

7. An element according to claim 1, wherein each of said insulating films is formed of an organic insulating film.

8. An element according to claim 7, wherein said organic insulating film is formed of a material selected from the group consisting of polyimide and unsaturated fatty acid.

9. An element according to claim 1, wherein each of said charge accumulating capacitors comprises a ferroelectric member and a pair of electrodes sandwiching said ferroelectric member.

10. An element according to claim 1, wherein each of said charge accumulating capacitors comprises a laminated film of an $SiO_2$ film, and an $Si_3N_4$ film a pair of electrodes sandwiching said laminated film.

11. An element according to claim 1, wherein each of said charge accumulating capacitors comprises a ferroelectric member formed of a material selected from the group consisting of $Si_3N_4$, polyethylene and polyparaxylylene, and a pair of electrodes sandwiching said ferroelectric member.

12. An element according to claim 1, wherein each of said charge accumulating capacitors comprises a laminated film of an $SiO_2$ film, an $Si_3N_4$ film, and a dielectric film a pair of electrodes sandwiching said laminated film.

13. A memory device comprising:

a multilayer tunnel switch portion formed of conductive and insulating films which are alternately stacked, both ends of said multilayer tunnel switch portion in a stacking direction being formed of insulating films;

a write electrode formed on one of said insulating films which corresponds to one of both the ends of said multilayer tunnel switch portion;

a read electrode formed on the other of said insulating films which corresponds to the other of both the ends of said multilayer tunnel switch portion;

a plurality of charge accumulating capacitors respectively connected to said conductive films of said multilayer tunnel switch portion;

means for applying a write voltage pulse to said write electrode; and means for applying a read voltage pulse to said read electrode.

14. A device according to claim 13, further comprising means for simultaneously applying voltage pulses having different phases to said write electrode and said conductive film opposing said write electrode through said insulating film.

15. A device according to claim 13, further comprising means for simultaneously applying voltage pulses having different phases to said read electrode and said conductive film opposing said read electrode through said insulating film.

16. A device according to claim 13, further comprising means for sequentially applying positive and negative voltage pulses to each of said conductive films of said multilayer tunnel switch portion through a corresponding one of said charge accumulating capacitors respectively connected to said conductive films so as to sequentially transfer charges stored in each of said conductive films or each of said charge accumulating capacitors to one of said conductive films which is adjacent thereto or said charge accumulating capacitor connected thereto.

17. A device according to claim 13, further comprising means for applying a positive voltage pulse to one of the adjacent conductive films of said multilayer tunnel switch portion, and applying a negative voltage pulse to the other of the adjacent conductive films so as to transfer charges accumulated in one of said conductive films and one of said charge accumulating capacitors which is connected thereto to the other of said conductive films and the other of said charge accumulating capacitors which is connected thereto.

18. A device according to claim 13, wherein said conductive films have first, second and third conductive films and which further includes means for applying voltage pulses to said first, second and third conductive films of said multilayer tunnel switch portion, which are continuously stacked on each other, such that a positive voltage pulse is applied to said first conductive film, no voltage pulse is applied to said second conductive film, and a negative voltage pulse is applied to said third conductive film, thereby sequentially transferring charges accumulated in said first conductive film and one of said charge accumulating capacitors which is connected thereto to said second and third conductive films and said charge accumulating capacitors connected thereto.

19. A three-dimensional memory element comprising:

a multilayer tunnel switch portion formed by alternately stacking conductive and insulating films, both ends of said multilayer tunnel switch portion in a stacking direction consisting of insulating films;

a photoelectric conversion layer formed on one of said insulating film which corresponds to one of both the ends of said multilayer tunnel switch portion;

a transparent write electrode formed on said photoelectric conversion layer;

a read electrode formed on the other of said insulating films which corresponds to the other of both the ends of said multilayer tunnel switch portion; and a plurality of charge accumulating capacitors respectively connected to said conductive films of said multilayer tunnel switch portion.

20. A memory device comprising:
a multilayer tunnel switch portion formed by alternately stacking conductive and insulating films, both ends of said multilayer tunnel switch portion in a stacking direction consisting of insulating films;
a photoelectric conversion layer formed on said insulating film as one of both the ends of said multilayer tunnel switch portion;
a transparent write electrode formed on said photoelectric conversion layer;
a read electrode formed on said insulating film as the other of both the ends of said multilayer tunnel switch portion;
a plurality of charge accumulating capacitors respectively connected to said conductive films of said multilayer tunnel switch portion; and
optical pulse generating means for generating an optical pulse to be emitted onto said transparent write electrode, wherein
the optical pulse emitted from said optical pulse generating means onto said transparent write electrode is converted by said photoelectric conversion layer into an electrical signal, and the electrical signal is stored as write data.

21. A three-dimensional memory element comprising:
a multilayer tunnel switch portion formed by alternately stacking conductive and insulating films, one end of said multilayer tunnel switch portion in a stacking direction consisting of an insulating film and the other end thereof consisting of a conductive film;
a write electrode formed on said insulating film as one end of said multilayer tunnel switch portion;
a light-emitting layer formed on said conductive film as the other end of said multilayer tunnel switch portion;
a transparent read electrode formed on said light-emitting layer; and
charge accumulating capacitors respectively connected to said conductive films of said multilayer tunnel switch portion.

22. A memory device comprising:
a multilayer tunnel switch portion formed by alternately stacking conductive and insulating films, one end of said multilayer tunnel switch portion in a stacking direction consisting of an insulating film and the other end thereof consisting of a conductive film;
a write electrode formed on said insulating film as one end of said multilayer tunnel switch portion;
a light-emitting layer formed on said conductive film as the other end of said multilayer tunnel switch portion;
a transparent read electrode formed on said light-emitting layer;
charge accumulating capacitors respectively connected to said conductive films of said multilayer tunnel switch portion; and
means for applying a voltage between said transparent read electrode and one of said conductive films which corresponds to the other end of said multilayer tunnel switch portion, wherein
said light-emitting layer is fit by charges accumulated in said conductive films and said capacitors connected to said conductive films, to read out the accumulated charges as an optical pulse.

* * * * *